United States Patent
Zhang et al.

(10) Patent No.: US 7,183,540 B2
(45) Date of Patent: Feb. 27, 2007

(54) APPARATUS FOR MEASURING PHOTO DIODES' TEMPERATURE DEPENDENCE

(75) Inventors: Chao Zhang, Chengdu (CN); Xuefei Zeng, Chengdu (CN); Zhong Yang, Chengdu (CN); Yuanjun Huang, Chengdu (CN); Zhiyong Jiang, Chengdu (CN); Jun Cao, Chengdu (CN)

(73) Assignee: Fiberxon Inc., Santa Clara, CA (US)

( * ) Notice: Subject to any disclaimer, the term of this patent is extended or adjusted under 35 U.S.C. 154(b) by 31 days.

(21) Appl. No.: 11/082,357

(22) Filed: Mar. 17, 2005

(65) Prior Publication Data

US 2006/0208180 A1 Sep. 21, 2006

(51) Int. Cl.
*H01J 7/24* (2006.01)

(52) U.S. Cl. ................... 250/238; 250/214 C
(58) Field of Classification Search ........... 250/238, 250/214 A, 214 AG, 214 C; 398/202
See application file for complete search history.

(56) References Cited

U.S. PATENT DOCUMENTS

| | | | |
|---|---|---|---|
| 4,153,835 A * | 5/1979 | Lau et al. ............... | 250/214 C |
| 5,588,080 A | 12/1996 | Kawamura | |
| 5,953,690 A * | 9/1999 | Lemon et al. .............. | 702/191 |
| 6,313,459 B1 * | 11/2001 | Hoffe et al. ............ | 250/214 R |
| 6,371,663 B1 | 4/2002 | Kneier | |
| 6,687,635 B2 | 2/2004 | Horne | |
| 6,700,654 B2 | 3/2004 | Gerrish | |
| 6,741,622 B2 | 5/2004 | Otsuka | |
| 6,801,454 B2 | 10/2004 | Wang | |
| 6,809,300 B2 | 10/2004 | Wakui | |
| 2002/0093796 A1 | 7/2002 | Medina | |
| 2003/0027440 A1 | 2/2003 | Birch | |
| 2003/0044121 A1 | 3/2003 | Shang | |
| 2003/0049000 A1 | 3/2003 | Wu | |
| 2003/0072137 A1 | 4/2003 | Yen | |
| 2003/0072540 A1 | 4/2003 | Huang | |
| 2003/0156801 A1 | 8/2003 | Hwang | |
| 2003/0194190 A1 | 10/2003 | Huang | |
| 2003/0206403 A1 | 11/2003 | Zaremba | |
| 2003/0210917 A1 * | 11/2003 | Stewart et al. .............. | 398/209 |
| 2003/0214789 A1 | 11/2003 | Medina | |
| 2004/0008954 A1 | 1/2004 | Shaw | |
| 2004/0029417 A1 | 2/2004 | Engel | |
| 2004/0129863 A1 * | 7/2004 | Cheung et al. ......... | 250/214 C |

* cited by examiner

*Primary Examiner*—Thanh X. Luu
*Assistant Examiner*—Stephen Yam
(74) *Attorney, Agent, or Firm*—Xin Wen

(57) ABSTRACT

A system for measuring gains of a plurality of photo diodes includes a chamber adapted to host the plurality of photo diodes and a temperature control unit configured to control the temperature within the chamber to a predetermined temperature. A control unit selects at least one of the plurality of photo diodes. A hosting unit is configured to provide a bias voltage to the selected photo diode at the predetermined temperature. A light source transmits photo signals to the selected photo diode at the predetermined temperature. A measurement unit configured to measure current signals generated by the selected photo diode in response to the photo signals under the bias voltage at the predetermined temperature.

20 Claims, 5 Drawing Sheets

US 7,183,540 B2

APPARATUS FOR MEASURING PHOTO DIODES' TEMPERATURE DEPENDENCE

TECHNICAL FIELD

This disclosure relates to electro-optical devices, specifically, the measurement of gain factors of photo diodes for telecommunication applications.

CROSS-REFERENCES TO RELATED INVENTIONS

The present invention is related to commonly assigned U.S. patent application Ser. No. 10/741,805, filed on Dec. 19, 2003, titled "Bi-directional optical transceiver module having automatic-restoring unlocking mechanism", commonly assigned U.S. patent application Ser. No. 10/815,326, filed on Apr. 1, 2004, titled "Small form factor pluggable optical transceiver module having automatic-restoring unlocking mechanism and mechanism for locating optical transceiver components", commonly assigned U.S. patent application Ser. No. 10/850,216, filed on May 20, 2004, titled "Optical Transceiver module having improved printed circuit board", commonly assigned U.S. patent application Ser. No. 10/893,803, filed on Jul. 19, 2004, titled "Single fiber optical transceiver module", and commonly assigned Chinese Patent Application No. 200420034040.X filed on Jun. 15, 2004, titled "An APD Bias Voltage Test Equipment". The disclosures of these related applications are incorporated herein by reference.

BACKGROUND

Computers are increasingly being connected to communication lines and other devices or networks with the computers performing as servers to the peripherally connected computers or devices. The data transfer throughput of computer servers can be increased significantly by using fiber optic lines.

An important component of many optical communication systems is the photo-detector which converts the optical signal into electric current. However, to overcome the degrading effect of circuit noise inherent in the electronic component of the receiver (in pre-amplifier stage), the conversion of light into electricity must be accompanied by amplification. A commonly used photo-detector that simultaneously detects light and internally amplifies the current is the Avalanche Photo Diode (APD). An APD is a solid state device (reverse-biased p-i-n junction) that can generate high gains. Each absorbed photon is converted into a photo-current pulse whose total area is a large multiple of the electronic charge. This gain factor, however, is inherently noisy: the net gain fluctuates each time a photon is absorbed.

Gain factor of photo-current of APD affects the receiving sensitivity. A high gain factor generates a relatively high shot noise and therefore decreases the detecting sensitivity of the system, whereas a low gain factor generates a low photo-current pulse below the optimal level of sensitivity. The level of the photo-current gain factor for an APD depends on the bias voltage applied to the APD. A higher bias voltage on an APD translates to a higher gain factor. The key to improve detecting sensitivity of the system is to the bias voltage on the APD such that the APD generates a high photo-current pulse while keeping the shot noise as low as possible.

Because an APD works with high internal fields, it can be sensitive to changes in the operating temperature. When holding the APD bias voltage constant, an increase in temperature will decrease the avalanche gain. A temperature compensation circuit on the APD bias voltage supply is typically used if the required operating temperature range is large enough to significantly impact on receiver performance.

One commonly used methodology to compensate the APD bias voltage is based on the generation and use of an informal formula, derived from pervious experiences. The formula is first used to estimate the temperature-to-bias-voltage characteristics at various temperature environments. The parameters of the compensation circuit are adjusted during testing. Due to individual difference of optical-electronic components, there is a big error to the estimation methodology. Since there are many parameters affecting the compensation circuit, this methodology with a single informal formula offers a hard adjustment and a low efficiency. Sometimes the APD even cannot achieve a high sensitivity after the bias voltage compensation based on this methodology.

SUMMARY

In one aspect, the present application relates to a system for measuring gains of a plurality of photo diodes, comprising a chamber adapted to host the plurality of photo diodes;

a temperature control unit configured to control the temperature within the chamber to a predetermined temperature;

a control unit configured to select at least one of the plurality of photo diodes;

a hosting unit configured to provide a bias voltage to the selected photo diode at the predetermined temperature;

a light source configured to transmit photo signals to the selected photo diode at the predetermined temperature; and a measurement unit configured to measure current signals generated by the selected photo diode in response to the photo signals under the bias voltage at the predetermined temperature.

In another aspect, the present application relates to a system for measuring gains of a plurality of photo diodes, comprising a chamber adapted to host the plurality of photo diodes;

a temperature control unit configured to control the temperature within the chamber to a predetermined temperature;

a control unit configured to select at least one of the plurality of photo diodes and to send a bias control signal;

a booster circuit comprising a digital potentiometer, configured to receive the bias control signal from the control unit wherein the digital potentiometer generates a bias voltage for the selected photo diode in response to the bias control signal;

a light source configured to transmit photo signals to the selected photo diode at the predetermined temperature;

a measurement unit configured to measure current signals generated by the selected photo diode in response to the photo signals under the bias voltage at the predetermined temperature, wherein the control unit is configured to receive the measured current signals from the measurement unit and to compute the gain factor of the selected photo diode at the predetermined temperature using the measured current signals.

In still another aspect, the present application relates to a method for measuring gains of a plurality of photo diodes, comprising controlling the environment of a plurality of photo diodes to a predetermined temperature;

selecting a first photo diode from the plurality of photo diodes;

providing a bias voltage to the first photo diode at the predetermined temperature;

transmitting photo signals at a predetermined intensity to the first photo diode at the predetermined temperature;

measuring current signals generated by the first photo diode at the predetermined temperature in response to the photo signals; and computing the gain factor of the first photo diode under the bias voltage diode at the predetermined temperature using the measured current signals and the predetermined intensity.

The disclosed apparatus measures the gain factor of an Avalanche Photo Diode (APD) as a function of temperature. The apparatus comprises a test chamber with its inside temperature accurately controllable and a hosting unit residing in the test chamber. A light source unit emits test light signals and transmits the test light signals through a fiber optical line to the hosting unit. A current/voltage measurement unit measures the photo-current generated by the APD and the bias voltage applied to the APD. A control unit controls the temperature inside the test chamber, and the bias voltage applied to the APD.

The disclosed methods and system provide efficient means to measure the gain factors of a plurality of photo diodes, which reduces the temperature equilibrium times in using a single diode test chamber to sequentially test multiple diodes. The test throughput is significantly increased and the costs of the measurement reduced.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

This invention is to provide an apparatus to the measurement of the bias voltage for a plurality of Avalanche Photo Diodes (APD) as well as their photo-currents at different temperatures. The apparatus automatically measures the bias voltage applied to each APD as a function of the environment temperature while maintaining the photo-current output of each APD at a proper level. The data obtained from the measurement is recorded with high efficiency and precision, which satisfies the testing requirements of mass production.

Figure 1:
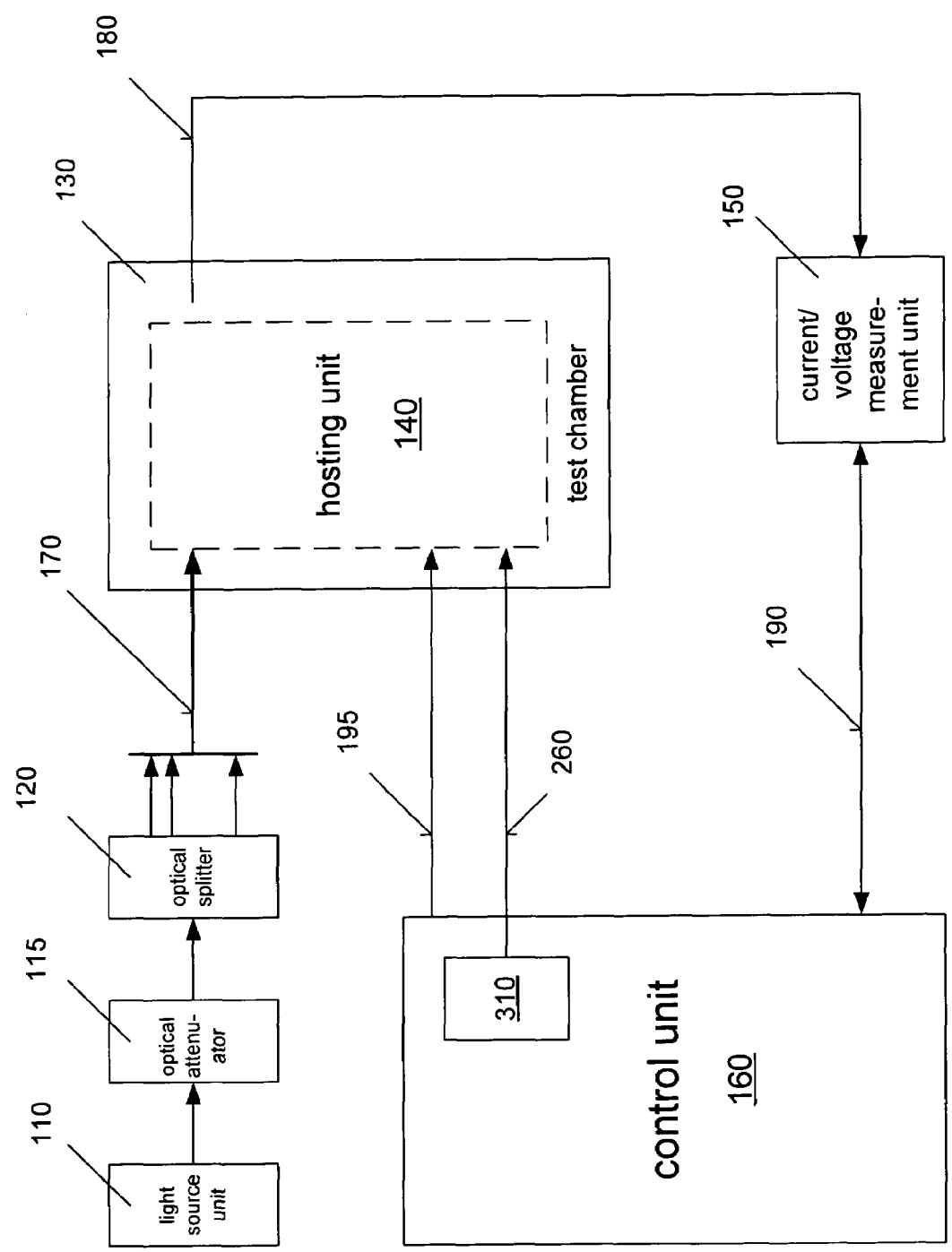
FIG. 1 is a block diagram for an apparatus to measure the gain factors of a plurality of photodiodes as a function of temperature.

A block diagram for the apparatus is shown in FIG. 1. The apparatus comprises a light source unit 110, an optical attenuator 115 and an optical splitter 120, a test chamber 130, a hosting unit 140, a current/voltage measurement unit 150 and a control unit 160.

The light source unit 110 produces the input for the multiple Avalanche Photo Diodes to be tested. The light from the light source unit 110 is sent to the optical attenuator 115, where the source light's intensity is adjusted to the right level. The light through the optical attenuator 115 is sent to an optical splitter 120, where the light is multiplexed into a number of light channels, for example eight channels, shown as light signals 170 in FIG. 1. Light signals 170 from the optical splitter are sent to the APD under the measurement directly through an optical fiber. The APD are clamped in the hosting unit 140, which resides in the test chamber 130.

The test chamber 130 has an electronic heater. By changing the power supplied to the electronic heater of the test chamber 130, the temperature inside the test chamber 130 can be accurately changed. The temperature changes inside the test chamber 130 emulates the real environments temperature changes that an APD will be in when it is put in use in a real optical communication system.

Inside the test chamber 130 is the hosting unit 140 where a number of Avalanche Photo Diodes, for example eight, reside. These eight Avalanche Photo Diodes detect for any light signals from the light signal lines 170. The hosting unit 140 also takes a control input line 195 from the control unit 160.

The hosting unit 140 outputs the bias voltage applied on one of the eight Avalanche Photo Diodes, together with the photo-current the APD generates to the current/voltage measurement unit 150 through the APD bias voltage/current line 180. The measurement unit 150 measures the bias voltage and the photo-current and produces the corresponding digital data for the measurements. Then the measurement unit 150 sends the digital readings, through the data cable 190, to the control unit 160.

The control unit 160 takes the digital readings of the bias voltage on an APD and the photo-current from the measurement unit 150 and records the digital reading in its memory unit. The control unit 160 then sends out a control signal, through the control signal line 195 to the hosting unit 140. The control signal includes the information of temperature setting in the test chamber 130, which APD is to be tested, and what bias voltage is to be applied to the APD. The control unit 160 sends control signal 195 to adjust the APD bias voltage to ensure the APD produces a proper level of photo-current at a certain input optical power. The software of the control unit 160 will do this work automatically Before the tests get started, information such as the temperature range inside the test chamber 130 and the temperature increase step needs to be set the control unit 160. The measurement may start with room temperature. The control unit 160 sends out control signals to the hosting unit 140 to test APD #1. Following this commend, a switch circuit inside the hosting unit 140 applies the bias voltage to APD #1. The photo-current from APD #1 is measured by the measurement unit 150 and is sent to the control unit 160. The control unit 160 keeps on adjusting the bias voltage on APD

1 according to the photo-current readings from the measurement unit 150 until the photo-current from APD #1 reaches to a proper level. At this point, the current/voltage measurement unit 150 shifts to the voltage measurement mode to measure the bias voltage applied to APD #1. After recording the bias voltage and the ambient temperature the measurement for APD #1 is finished.

The control unit 160 then sends out control signals to the hosting unit 140 to test APD #2. The test goes on until all eight Avalanche Photo Diodes have been tested. Then the control unit sends out control signals to the hosting unit 140 and the test chamber 130 to increase the temperature inside the test chamber by the temperature increase step, 30 degrees Celsius for example. After the temperature inside the test chamber 130 reaches and stables at the desired level, the control unit 160 sends out control signals to the hosting unit 140 to test the eight Avalanche Photo Diodes one by one again, at a higher environment temperature this time. When the second round of measurement is finished on all eight Avalanche Photo Diodes, the control unit 160 sends out control signals to the test chamber 130 to raise the temperature by another 30 degrees Celsius. When the target temperature is reached, the control unit 160 instructs the hosting unit 140 to perform another round of test on the eight Avalanche Photo Diodes. This loop is kept on by the control unit 160 until the whole desired temperature range is covered. When the measurement is completed, the bias voltage as a function of the ambient temperature can be fit to an analytical function by a numerical fit.

Figure 2:
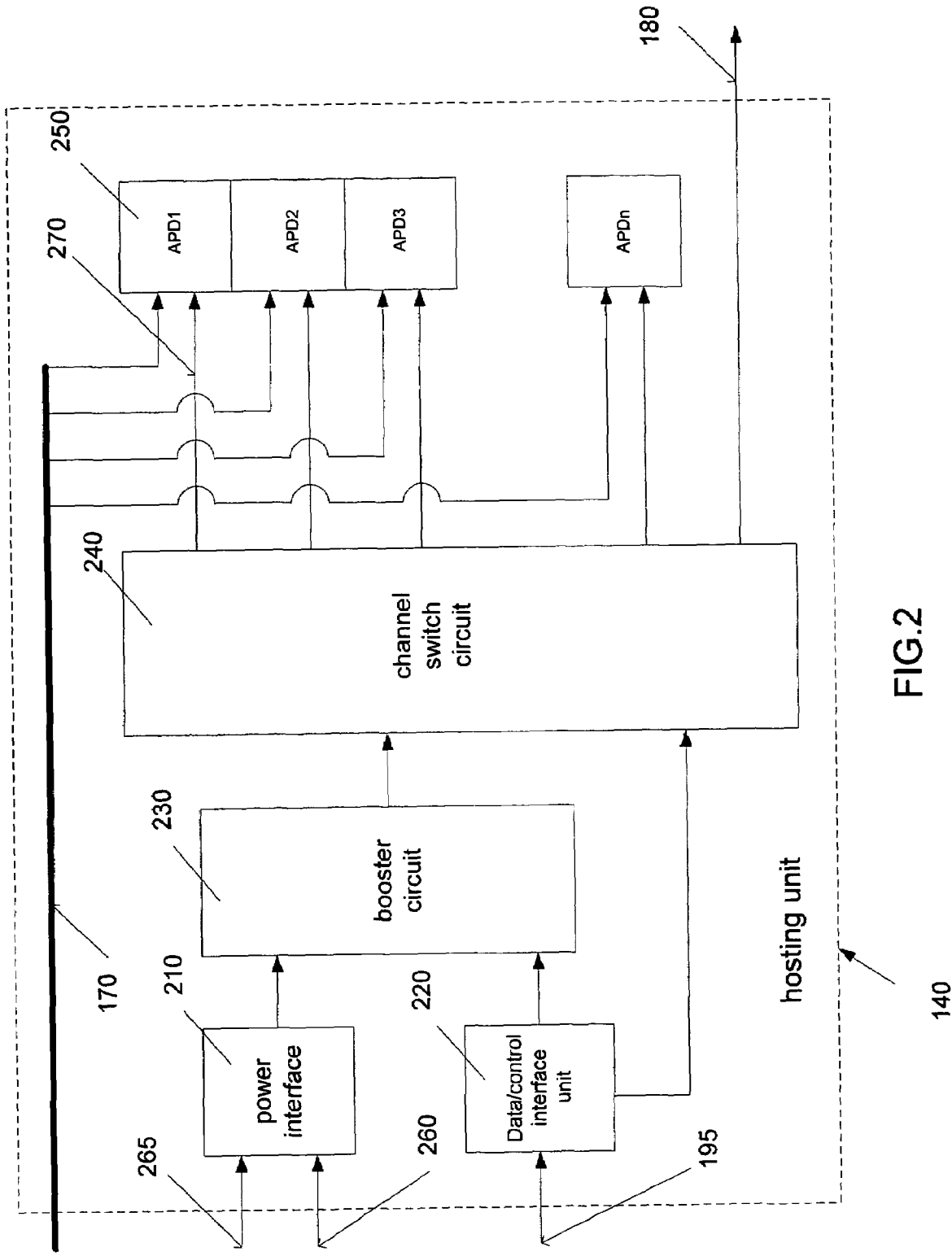
FIG. 2 is a block diagram for the hosting unit of the apparatus of FIG. 1.

A more detailed block diagram of the hosting unit 140 is shown in FIG. 2. The hosting unit 140 comprises a power interface 210, a data/control interface unit 220, a boost circuit 230, a channel switch circuit 240, and a set of sockets to rigidly hold the multiple Avalanche Photo Diodes 250 to be tested.

Figure 3:
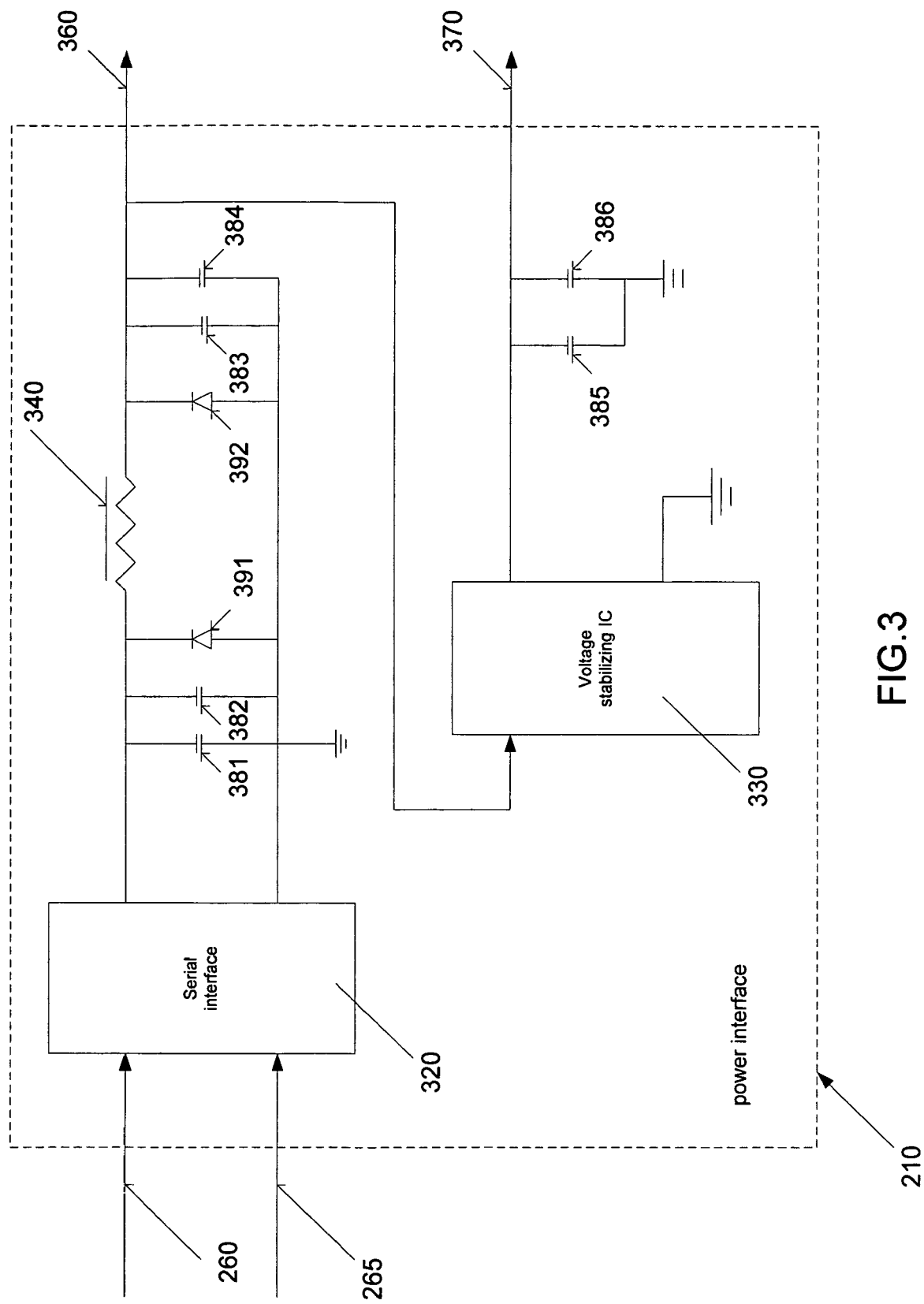
FIG. 3 is a block diagram for the power interface unit of FIG. 1.

The power interface 210, shown in FIG. 3, provides two power supplies that are used in the hosting unit 140, a +5V power supply and a +3.3V power supply. The power interface 210 takes a +5V power input 260 from a USB interface of the control unit 160, as well as a +3.3V power input 265 from the system power supply. The two power supplies are stabilized through the capacitors, transistors and inductors in the power interface 210, and produce two power supplies 360 and 370 for the hosting unit 140 to use.

Figure 4:
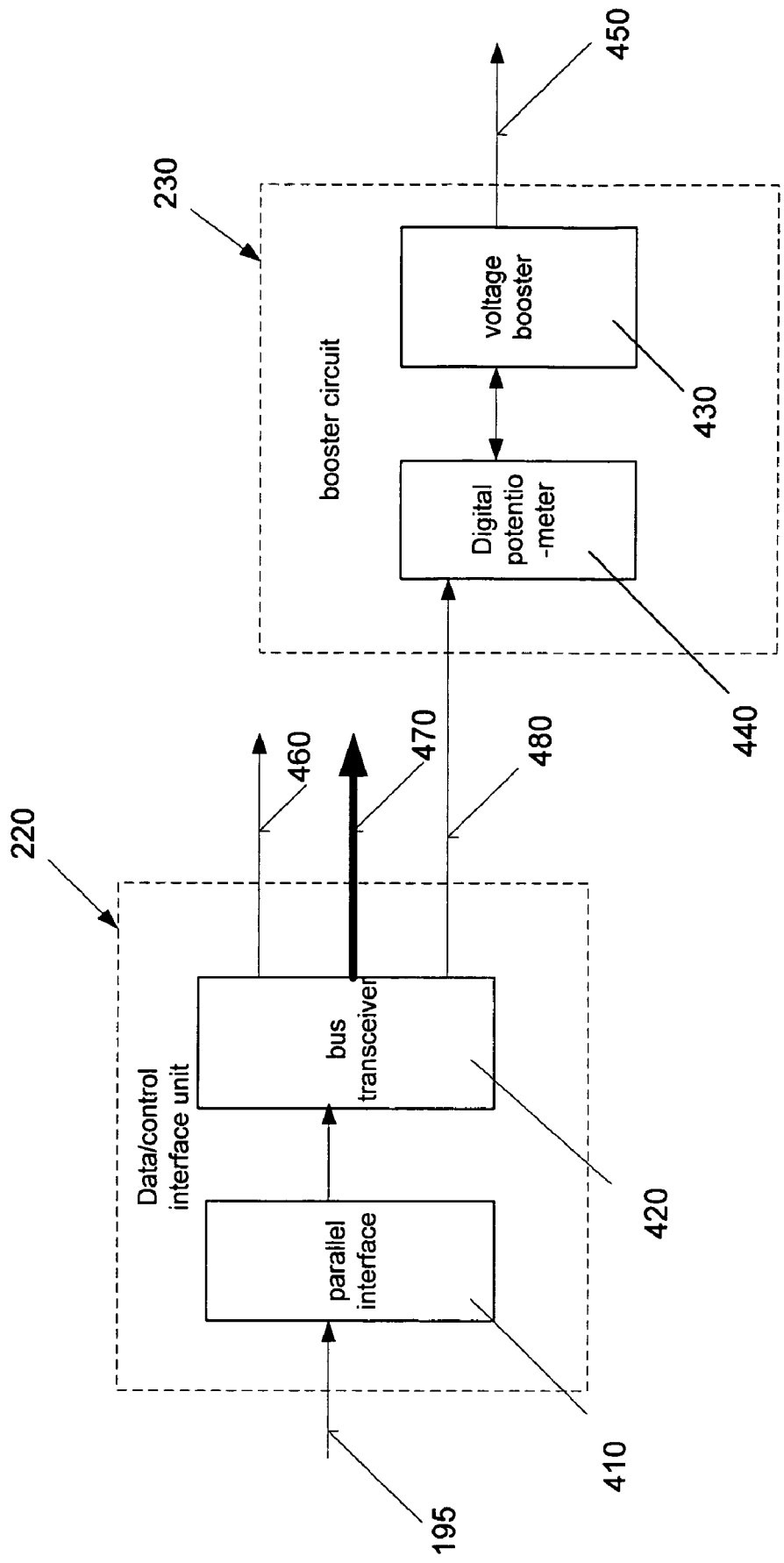
FIG. 4 is a block diagram for the data/control interface unit of FIG. 1.
Figure 5:
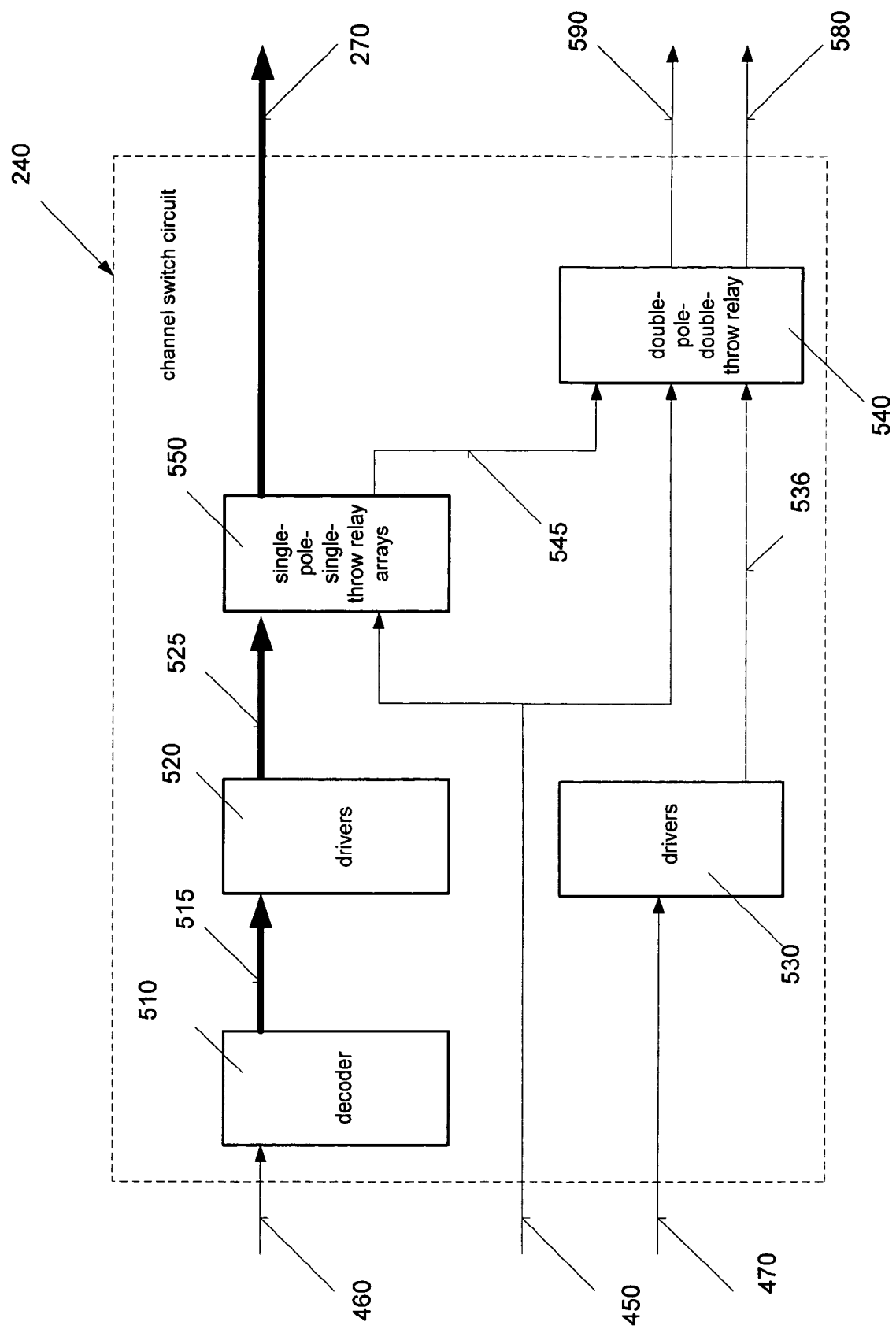
FIG. 5 is a block diagram for the switch unit of FIG. 1.

The data/control interface unit 220 provides control signals for the hosting unit 140. A block diagram for the data/control interface unit 220 is shown in FIG. 4. The data/control interface unit 220 comprises two major blocks, a parallel interface 410 and an octal bus transceiver with 3-state outputs 420. The parallel interface 410 accepts the control signal 195, which comes from the control unit 160. One piece of information in the control signal 195 is a 3-bit encoded channel select signal 470 that informs the hosting unit 140 which channel is to be tested. Another piece of information in the control signal 195 is the host select signal 460 which shifts the measurement mode of the current/voltage measurement unit 150 between current for measurement of photo-current and voltage for measurement of bias-voltage.

The data/control interface unit 220 also transmits the bias voltage control signal 480 to the boost circuit 230 for the bias voltage setting applied to the APD under tests shown in FIG. 4. The boost circuit 230 comprises two major blocks, a voltage boost circuit 430, and a dual temperature controlled digital potentiometer 440. The digital potentiometer 440 takes the bias voltage control signal 480 and changes the resistance value based on the bias voltage control signal 480. The change in the resistance value causes the output of the voltage boost circuit 430 to change. This output of the boost circuit 430, marked as part 450 in FIG. 4, is the input signal to provide the bias voltage of the APD under test.

The outputs from the data/control interface unit 220 and the boost circuit 230, the channel select signal 470, the host select signal 460 and the bias voltage control signal 450, are connected to the channel switch block 240.

The channel switch block 240 comprised five major blocks, a decoder 510, two drivers 520 and 530, a double-pole double throw relay 540 and eight pieces of single pole single throw relay arrays 550.

The decoder 510 takes the coded channel select signal 470 and decodes the 3-bit channel select into 8-bit channel select signals 515. Of these eight channel select signals, only the bit for the APD to be tested is set low while the other seven are set high. For example, a channel select 515 value of 1111_1110 means that channel 1 is selected and this channel is closed, while all the other seven channels are open.

The decoded channel select signal 515 has a low driving power. Driver 520 raises the driving powers of the channel select signals 515 to channel select signals 525.

The eight pieces of single-pole-single-throw relay arrays 550 take the channel select signal 525 as well as the bias voltage input 450 as the inputs. Depending on the channel select signal 525, one of the eight APD is selected and the bias voltage supply 450 is applied to the selected APD. For example, if the channel select signal 525 is 1111 1110, channel 1 is selected. The single-pole single-throw array #1 is closed while the other seven arrays are open. The bias voltage supply 450 is applied to APD #1. If channel select signal 525 is 0000_0010, channel 2 is selected. The single-pole single-throw array #2 is closed while the other seven arrays are open. The bias voltage supply 450 is then applied to APD #2. Unit 550 generates output signals 270 (the bias voltage on each of the Avalanche Photo Diodes) and 545 (the photo-current produced by the APD under the test). The photo-current produced by the APD under the test 545 is an input to a double-pole-double-throw relay 540. Two other inputs to unit 540 are the bias voltage input 450, and a current/voltage select signal 536. The current/voltage select signal 536 is the output of a driver 530, which raises the driving power of the current/voltage select signal 470, which comes from bus transceiver 420. Depending on the value of the current/voltage select signal 470, unit 540 outputs either the photo-current from the APD currently under test, signal 580, or the bias voltage applied to the APD, signal 590. The combination of signals 580 and 590 makes signal 180, which is the input to the current/voltage measurement unit 150. Coupled with unit 540, the measurement unit 150 measures the photo-current 580 or the bias voltage 590 depending on the value of the current/voltage select signal 536.

During the test, when the bias voltage is applied to APD #1, a photo-current is generated by APD #1 and this photo-current is measured by the measurement unit 150. With the photo-current as a feedback input, the control unit 160 sends out control signals to the hosting unit 140 to adjust the bias voltage on APD #1. With the adjusted bias voltage on APD #1, another photo-current from APD #1 is measured and feeds back to the control unit 160. This process is repeated until the photo-current from APD #1 reaches to a proper level. The measurement for APD #1 at this current temperature is finished, and the optimal values of bias voltage and the corresponding photo-current are recorded by the control unit 160.

The control unit 160 then sends control signals to the hosting unit 140 to measure APD #2 and the process is repeated on the rest of the Avalanche Photo Diodes in the hosting unit 140.

The control unit 160 then sends control signals to the hosting unit 140 to raise the temperature in the test chamber 130 by a fixed number of degrees, 30 degrees for example. And the above measurements are repeated on all of the Avalanche Photo Diodes at the new temperature. Then the temperature is raised again for the same measurements at a different temperature point. This process is repeated until the whole pre-determined temperature range is covered.

The recorded data at the control unit 160 for each individual APD as a function of its environment temperature produces an accurate character for the variation of the proper bias voltage of the individual APD with respect of temperature changes. Using the data points produced by this apparatus, a functional curve can be fit between the bias voltage applied and its ambient temperature using a numerical fitting method. This curve produces a bias voltage compensation value at any given ambient temperature that is more accurate than bias voltage compensation calculated by using any general formula.

The temperature compensation of APD is applicable to minimizing temperature variations in opto-electrical and electro-optical signal transformations in optical transceiver devices comprising APDs. Details of the structures and operations of optical transceiver devices are disclosed in the above referenced and commonly assigned U.S. patent application Ser. No. 10/741,805, filed on Dec. 19, 2003, titled "Bi-directional optical transceiver module having automatic-restoring unlocking mechanism", commonly assigned U.S. patent application Ser. No. 10/815,326, filed on Apr. 1, 2004, titled "Small form factor pluggable optical transceiver module having automatic-restoring unlocking mechanism and mechanism for locating optical transceiver components", commonly assigned U.S. patent application Ser. No. 10/850,216, filed on May 20, 2004, titled "Optical Transceiver module having improved printed circuit board", commonly assigned U.S. patent application Ser. No. 10/893,803, filed on Jul. 19, 2004, titled "Single fiber optical transceiver module", and commonly assigned Chinese Patent Application No. 200420034040.X filed on Jun. 15, 2004, titled "An APD Bias Voltage Test Equipment".

Another advantage of the apparatus is that it is capable of measuring multiple Avalanche Photo Diodes with a single temperature equilibration. The apparatus consists of sockets that can hold multiple Avalanche Photo Diodes that allows measurements of the multiple Avalanche Photo Diodes at each temperature point. The apparatus reduces the temperature equilibrium time and diode mounting time in using a single diode test chamber to sequentially test multiple diodes.

Yet another advantage of this apparatus is, all the measurements at each and every temperature points on each any every APD inside the test chamber are made automatically, controlled by the software system installed in the control system. And all of the measurement results are automatically recorded in the control unit. Once the apparatus is properly set up, it can be easily used in the calibration for a big number of avalanche photo diodes.

Finally, although the number eight has been used as an example in the discussion for the total number of Avalanche Photo Diodes tested in the apparatus, the discussion should not be limited to only eight. The apparatus can be expanded to measure any number of Avalanche Photo Diodes within the physical limit of the hosting unit and the test chamber. To make a full use of the decoder for the channel selection signals, it is better to make the number of Avalanche Photo Diodes in the test $2^n$ where n is a digital number.

Part Numbers
110 light source unit
115 optical attenuator
120 optical splitter
130 test chamber
140 hosting unit
150 current/voltage measurement unit
160 control unit
170 Input optical signals
180 APD bias voltage/current signal line
190 data cable
195 Control signal line
210 power interface
220 data/control interface unit
230 boost circuit
240 channel switch circuit
250 Series of APD's
260 +5V system power supply
265 +3.3V system power supply
270 bias voltage on individual APD (VPD[7:0])
310 USB interface
320 Serial interface
330 voltage stabilizing IC
340 Inductor
360 +5V output signal
370 +3.3V output signal
381 capacitor
382 capacitor
383 capacitor
384 capacitor
385 capacitor
386 capacitor
391 diode
392 diode
410 parallel interface
420 bus transceiver (Octal bus transceiver with 3-state outputs)
430 voltage boost circuit
440 digital potentiometer
450 bias voltage input
460 3 bit channel select signal
470 host current/voltage select signal
480 VPDin control signal
510 decoder
515 decoded 8-bit channel select signals
520 drivers
525 channel select signals with higher driving power
530 drivers
536 host current/voltage select signal with higher driving power
540 double-pole-double-throw relay
545 photo-current from APD
550 eight pieces of single-pole-single-throw relay arrays
580 photo-current sent to current/voltage measurement unit
590 bias voltage sent to current/voltage measurement unit

What is claimed is:

1. A system for measuring amplification gain factors of a plurality of photo diodes, comprising
a chamber adapted to host the plurality of photo diodes;
a temperature control unit configured to control the temperature within the chamber to a predetermined temperature;

a control unit configured to select at least one of the plurality of photo diodes;

a hosting unit configured to provide a bias voltage to the selected photo diode at the predetermined temperature;

a light source configured to transmit a photo signals to the selected photo diode at the predetermined temperature; and a measurement unit configured to measure a current signals generated by the selected photo diode in response to the photo signals under the bias voltage at the predetermined temperature to produce an electronic signal, wherein the control unit is configured to compute an amplification gain factor of the selected photo diode under the bias voltage at the predetermined temperature using the electronic signal.

2. The system of claim 1, wherein the control unit is configured to send a bias control signal to the hosting unit to provide the bias voltage to the selected at least one photo diode.

3. The system of claim 2, wherein the hosting unit comprises a digital potentiometer configured to receive the bias control signal from the control unit and to generate the bias voltage for the selected at least one photo diode in response to the bias control signal.

4. The system of claim 1, further comprising:

a USB interface in the control unit; and a power interface configured to receive a power supply signal from the USB interface and to provide power to the hosting unit.

5. The system of claim 1, further comprising:

a booster circuit configured to generate a bias voltage for the selected at least one photo diode in response to the bias control signal; and a channel switch circuit comprising an array of single-pole-single-throw relays, wherein at least one of the single-pole-single-throw relays is configured to receive a channel select signal from the control circuit and to allow the bias voltage to be applied to the selected at least one photo diode in response to the channel select signal.

6. The system of claim 1, further comprising:

a data/control interface unit configured to receive a selection signal from the control unit to select at least one of the plurality of photo diodes.

7. The system of claim 1, further comprising:

a photo splitter configured to switch the photo signals from the light source to transmit to the selected photo diode.

8. The system of claim 1, further comprising:

a photo attenuator configured to attenuate the intensity of the photo signals from the light source to transmit to the selected photo diode.

9. The system of claim 1, wherein the plurality of photo diodes include at least one Avalanche Photo Diode.

10. A system for measuring amplification gain factors of a plurality of photo diodes, comprising a chamber adapted to host the plurality of photo diodes;

a temperature control unit configured to control the temperature within the chamber to a predetermined temperature;

a control unit configured to select at least one of the plurality of photo diodes and to send a bias control signal;

a booster circuit comprising a digital potentiometer, configured to receive the bias control signal from the control unit wherein the digital potentiometer generates a bias voltage for the selected photo diode in response to the bias control signal;

a light source configured to transmit photo signals to the selected photo diode at the predetermined temperature;

a measurement unit configured to measure current signals generated by the selected photo diode in response to the photo signals under the bias voltage at the predetermined temperature, wherein the control unit is configured to receive the measured current signals from the measurement unit and to compute the amplification gain factor of the selected photo diode at the predetermined temperature using the measured current signals.

11. The system of claim 10, further comprising:

a photo splitter configured to switch the photo signals from the light source to transmit to the selected photo diode.

12. The system of claim 10, further comprising:

a photo attenuator configured to attenuate the intensity of the photo signals from the light source to transmit to the selected photo diode.

13. The system of claim 10, wherein the plurality of photo diodes include at least one Avalanche Photo Diode.

14. A method for measuring amplification gain factors of a plurality of photo diodes, comprising:

controlling the environment of a plurality of photo diodes to a predetermined temperature;

selecting a first photo diode from the plurality of photo diodes;

providing a bias voltage to the first photo diode at the predetermined temperature;

transmitting a photo signals at a predetermined intensity to the first photo diode at the predetermined temperature;

measuring a current signals generated by the first photo diode at the predetermined temperature in response to the photo signal to produce an electronic signal; and computing an amplification gain factor of the first photo diode under the bias voltage at the predetermined temperature using the electronic signal and the predetermined intensity.

15. The method of claim 14, further comprising:

providing a plurality of bias voltages to the first photo diode at the predetermined temperature; and computing amplification gain factors of the first photo diode under the plurality of bias voltages at the predetermined temperatures.

16. The method of claim 15, further comprising:

controlling the environment of a plurality of photo diodes to a plurality of predetermined temperatures; and computing amplification gain factors of the first photo diode under the bias voltage diode at the plurality of predetermined temperatures.

17. The method of claim 16, further comprising:

storing the computed amplification gain factors of the first photo diode as a function of temperature and the bias voltage; and compensating temperature variation in the amplification gain factor of the first photo diode by varying bias voltage.

18. The method of claim 14, further comprising:

selecting a second photo diode from the plurality of photo diodes;

providing a bias voltage to the second photo diode at the predetermined temperature;

transmitting photo signals at a the predetermined intensity to the second photo diode at the predetermined temperature;

measuring current signals generated by the second photo diode at the predetermined temperature in response to the photo signals; and computing the amplification gain factor of the second photo diode under the bias voltage at the predetermined temperature using the measured current signals and the predetermined intensity.

19. The method of claim 14, further comprising:

producing photo signals by a light source; and switching the photo signals to transmit to the first photo diode.

20. The method of claim 14, further comprising:

producing photo signals by a light source; and adjusting the intensity of the photo signals by a photo attenuator to produce attenuated photo signals to be received by the first photo diode.

* * * * *